US009817601B1

(12) United States Patent
Zhang et al.

(10) Patent No.: US 9,817,601 B1
(45) Date of Patent: Nov. 14, 2017

(54) METHOD AND APPARATUS FOR DETERMINING FEASIBILITY OF MEMORY OPERATING CONDITION CHANGE USING DIFFERENT BACK BIAS VOLTAGES

(71) Applicant: FREESCALE SEMICONDUCTOR, INC., Austin, TX (US)

(72) Inventors: Shayan Zhang, Austin, TX (US); Nihaar Mahatme, Austin, TX (US); Rakesh Pandey, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/204,190

(22) Filed: Jul. 7, 2016

(51) Int. Cl.
| | |
|---|---|
| G11C 5/14 | (2006.01) |
| G06F 3/06 | (2006.01) |
| G11C 11/419 | (2006.01) |
| G11C 7/10 | (2006.01) |
| G11C 16/30 | (2006.01) |
| G11C 11/413 | (2006.01) |
| G11C 7/06 | (2006.01) |
| G11C 11/4096 | (2006.01) |

(52) U.S. Cl.
CPC ............ *G06F 3/0634* (2013.01); *G06F 3/061* (2013.01); *G06F 3/0659* (2013.01); *G06F 3/0673* (2013.01); *G11C 11/419* (2013.01); *G11C 5/14* (2013.01); *G11C 7/06* (2013.01); *G11C 7/1045* (2013.01); *G11C 11/4096* (2013.01); *G11C 11/413* (2013.01); *G11C 16/30* (2013.01)

(58) Field of Classification Search
CPC ...... G06F 3/0634; G06F 3/0673; G06F 3/061; G06F 3/0659; G11C 11/419; G11C 11/413; G11C 7/1045; G11C 11/4096; G11C 5/14; G11C 7/06; G11C 16/30
USPC ..... 365/189.011, 226, 154, 189.11; 713/718; 711/154
See application file for complete search history.

(56) References Cited

U.S. PATENT DOCUMENTS

| 8,531,899 | B2 | 9/2013 | Zhang et al. | |
|---|---|---|---|---|
| 8,806,245 | B2 | 8/2014 | MacHnicki et al. | |
| 2005/0063211 | A1* | 3/2005 | Atallah | G11C 7/22 365/145 |
| 2006/0050572 | A1* | 3/2006 | Gouin | G11C 7/06 365/194 |
| 2006/0062052 | A1* | 3/2006 | Kumahara | G11C 16/30 365/189.08 |
| 2008/0062802 | A1* | 3/2008 | Lin | G11C 5/14 365/227 |
| 2008/0291768 | A1* | 11/2008 | Ramaraju | G11C 7/1045 365/230.05 |

(Continued)

*Primary Examiner* — Hong Kim

(57) ABSTRACT

A memory device having at least one output predicting a feasibility of whether the memory device will work properly at a different operating condition including a different supply voltage and/or a different operating frequency than the current supply voltage and/or the current operating frequency. A semiconductor device (e.g. a SoC chip) provides a test to either validate or invalidate the feasibility for the memory device to enter such a different operating condition based on read and write operations of the memory device in normal access cycles. The memory device is partitioned with at least a first memory unit and a second memory unit, which can be coupled to different back-bias voltages. This operating condition predicting function can be enabled or disabled by the semiconductor device in real time operation depending on the feasibility test results.

20 Claims, 10 Drawing Sheets

(56) References Cited

U.S. PATENT DOCUMENTS

| | | | |
|---|---|---|---|
| 2009/0279347 A1* | 11/2009 | Yamagami | G11C 5/14 365/154 |
| 2015/0095684 A1* | 4/2015 | Haraguchi | G06F 1/3243 713/323 |
| 2015/0325563 A1 | 11/2015 | Kamal et al. | |

* cited by examiner

300

METHOD AND APPARATUS FOR DETERMINING FEASIBILITY OF MEMORY OPERATING CONDITION CHANGE USING DIFFERENT BACK BIAS VOLTAGES

BACKGROUND

Field

The present invention relates generally to a method and apparatus for changing the operating condition of a memory device.

Related Art

A semiconductor device, for example a System-On-Chip (SoC) device, is often required to work in a low power mode to save energy or a high performance mode to achieve a maximum number of operations per second. An embedded memory is often one of the major limiting components of a SoC chip for performance and power consumption. Low-power operation often involves reducing the supply voltage of the SoC chip, while high performance operation often calls to increase supply voltage (Vdd over drive). However, reducing or increasing the supply voltage in memories may lead to functional failures while reading or writing the memory content.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
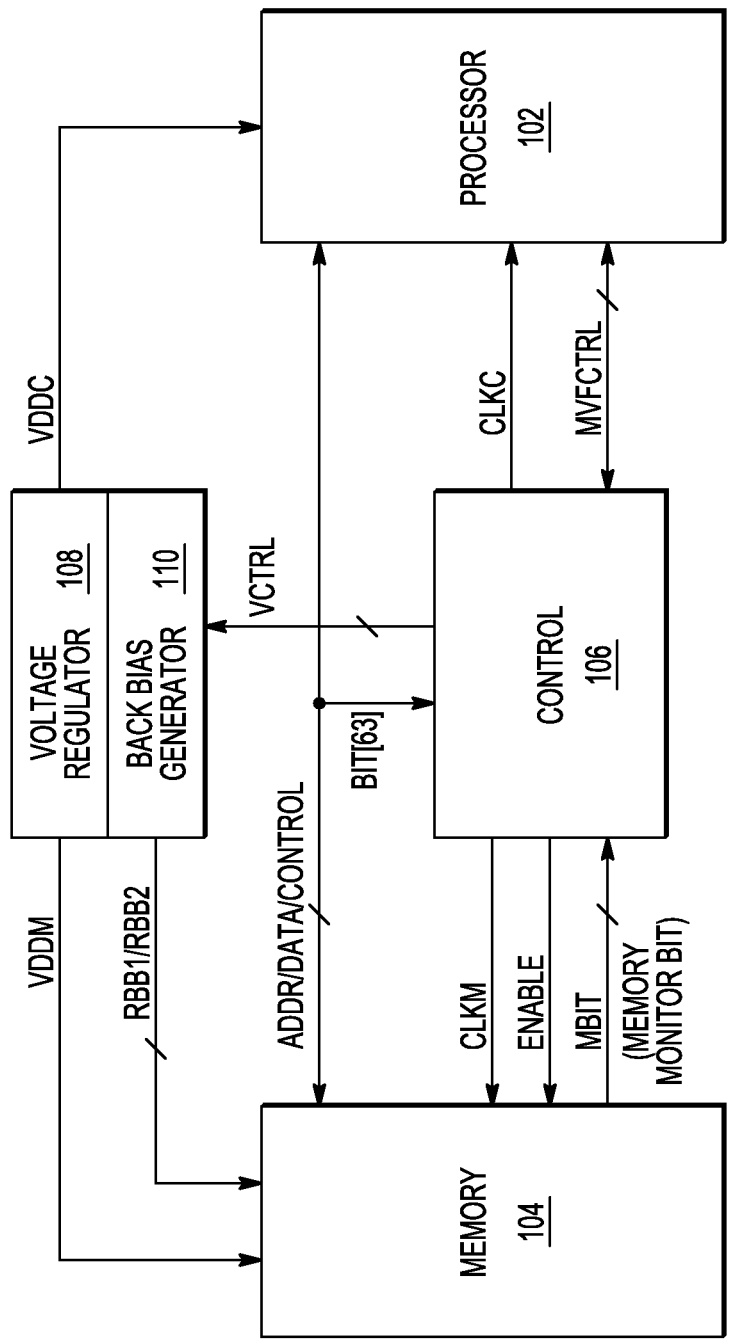
FIG. 1 illustrates, in block diagram form, a semiconductor device with embedded memory system in accordance with one embodiment of the present invention.

In a semiconductor device, for example a system-on-chip (SoC) chip, with embedded memory, low-power operation often involves reducing the voltage to save power. Lowering the voltage reduces the operating speed of CMOS logic circuits. Reducing the voltage in SRAM memories may lead to functional failures while reading or writing the memory content. This type of voltage-sensitive functional failures are primarily driven by local and global SRAM bitcell variations and design margins added to cover the uncertainties caused by device variations and aging effects of the chip. Besides the low power requirement, an embedded on-chip SRAM often limits the overall performance of a SoC chip. As memory accesses are one of the critical timing paths in SoC operations and a large amount of timing margins have to be added inside the memory module to cover the uncertainties mentioned above. To address these challenges, it is conventional to power the memory array through a separate supply voltage regulator while the rest of the SoC is powered through a different voltage regulator whose supply voltage can be lowered. The dedicated supply voltage regulator for SRAM can be kept above a minimum voltage level in low power modes, or can be over-driven above its nominal value for high performance. These conventional design methods increase system complexity and cost, and prevents optimal power reduction with minimum performance penalty and/or performance push at a minimum power penalty.

In one embodiment of the present invention, there is provided, a method of writing a data into both a first memory unit of the memory device and a second memory unit of the memory device while the memory device is operating at a first operating condition including a first supply voltage being supplied to both the first memory unit and the second memory unit and the memory device is at a first operating frequency, wherein the writing is performed while a first back bias voltage of the first memory unit is at a first voltage value and a second back bias voltage of the second memory unit is at a second voltage value different than the first voltage value; reading, after the writing, the data from the first memory unit and from the second memory unit while the memory device is operating in the first operating condition, wherein the reading is performed while a first back bias voltage of the first memory unit is at a third voltage value and a second back bias voltage of the second memory unit is at a forth voltage value different than the first voltage value; comparing the data read from the first memory unit with the data read from the second memory unit; determining based on the comparing, a feasibility of a second operating condition of the memory device, wherein the second operating condition is different than the first operating condition by at least one the group consisting of a different supply voltage from the first supply voltage to a memory unit of the memory device and a different operating frequency than the first operating frequency; and if determined to be feasible, operating the memory device at the second operating condition, wherein the operating includes reading and writing data to the first memory unit in the second operating condition. The method can be further carried out by determining whether the data read from the first memory unit matches or mismatches the data read from the second memory unit; incrementing and storing a first count in a first register or a second count in a second register as a result of a match or mismatch from the determining; and validating the second operating condition of the memory device if the first count is greater than a first predetermined number; transitioning from the first operating condition to the second operating condition based on the validating; and resetting the first count as a result of entering the second operating condition; or invalidating the second operating condition of the memory device if the second count is greater a second predetermined number; setting a flag indicating a predictable failure condition of the memory device to enter the second operating condition; resetting the first count as a result of invalidating the second operating condition; wherein the first and second predetermined numbers are programmable. One example of the operating condition change from the first operating condition to the second operating condition is to operating at a lower supply voltage value than the first supply voltage with the first operating frequency applied to the memory device. Another example is to operating at a higher operating frequency than the first operating frequency with the first supply voltage applied to the memory device. Or a third example is to operating the memory device at a lower supply voltage value than the first supply voltage and at a lower operating frequency than the first operating frequency.

In another embodiment of the present invention, there is provided a semiconductor device comprising: a first memory unit of a memory device comprising a first back bias terminal for biasing transistors of a first conductivity type, a second memory unit of the memory device comprising a second back bias terminal for biasing transistors of the first conductivity type; a data input coupled to write data to the first memory unit and to the second memory unit concurrently; a back bias generator including a first output to provide a back bias voltage to the first back bias terminal and a second output to provide a back bias voltage to the second back bias terminal, wherein the back bias generator can provide different back bias voltages to the first back bias terminal and the second back bias terminal at a same time. The semiconductor device includes a control unit including circuitry, the control unit includes: a first output coupled to the back bias generator to control the back bias voltage provided to the second back bias terminal; a comparison circuit including a first comparator input, a second comparator input, and a match output, the first comparator input is operably coupled to a data output of the first memory unit, the second comparator input is operably coupled to a data output of the second memory unit, the match output provides a determination of whether data received at the first comparator input and the second comparator input match; the control unit also includes a second output to provide an operating condition parameter value of the memory device from a plurality of operating condition parameter values associated with an operating condition parameter, wherein the operating condition parameter includes one of the group consisting of a supply voltage provided to the memory device, an operating frequency of the memory device, wherein the operating condition parameter value indicated by the second output is dependent upon the output of the comparison circuit comparing data from the first memory unit and the second memory unit during a read operation where a back bias voltage provided to the first back bias terminal was different than a back bias voltage provided to the second back bias terminal.

FIG. 1 illustrates, in block diagram form, a semiconductor device 100 in accordance with one embodiment of the present invention. Semiconductor device 100 includes a processor 102, a memory 104, a control unit 106, a voltage regulator 108, and a back bias generator 110. Memory 104 may be a SRAM, DRAM a flash NVM (non-volatile memory), or other type of memory device. However, for the discussions herein, it will be assumed that it is an SRAM. Memory 104 is coupled to processor 102, control unit 106, voltage regulator 108, and back bias generator 110. Memory 104 may be embedded within semiconductor device 100 or may be located externally in a separate chip embodiment. The control unit 106 may be located within processor 102 or may be located within memory 104. Memory 104, processor 102, and control unit 106 may be in the same power supply domain or may be located in different power supply domains. Memory 104 communicates data, address, and control with processor 102 to allow processor 102 to read or write data in memory 104. Memory 104 receives a supply voltage Vddm from voltage regulator 108 and a reverse back bias or a forward back bias voltages Rbb1/Rbb2 from back bias generator 110. The supply voltage Vddm value and back-bias or forward-bias voltage values are controlled by the control unit 106, in response to an operating condition command issued by processor 102 or by control unit 106.

Figure 2:
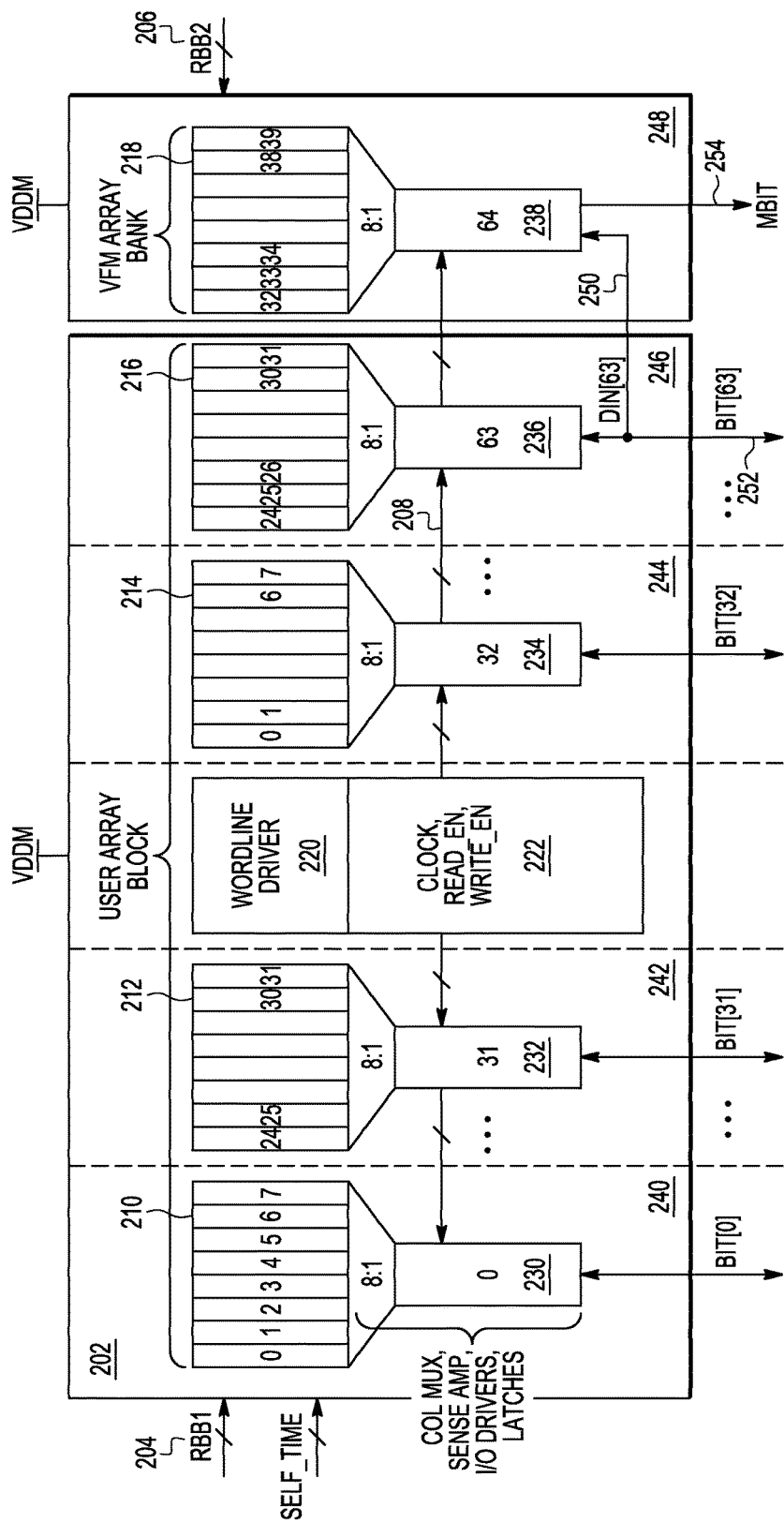
FIG. 2 illustrates, in block diagram form, the embedded memory of FIG. 1, in accordance with one embodiment of the present invention.

Memory 104 provides at least two data outputs, bit[63] and mbit, to control unit 106. The bit[63] can be any one of the data output bits and the data output mbit (memory monitor bit) provides real time information to control unit 106 for feasibility of memory operating condition (supply voltage, operating frequency, etc.) change in every memory cycle of accesses. Control unit 106 provides commands to change power supply voltage, back bias voltage, and operating clock frequency to memory 104. Control unit 106 also provides at least one control output, 'enable', to memory 104 to enable or disable the function of the output mbit from providing memory operating condition change feasibility information. This function of predicting feasibility of memory operating condition change is unique per die and can be programmed, via the mvfctrl (memory voltage and frequency control) signals from processor 102, to allow semiconductor device 100 to operate at its optimum condition for either low power with a lower supply voltage value or high performance with a higher clock frequency value. Operation of FIG. 1 will be described in more detail in reference to FIGS. 2-9. FIG. 2 illustrates, in block diagram form, memory 104 of FIG. 1, in accordance with one embodiment of the present invention. Memory 104 includes a plurality of memory units 240-248. Row decoder/wordline drivers 220, column decoder/multiplexer control logic and sense amplifier control logic 230-238 are coupled to all the memory units. Each memory unit includes a plurality of bitcell arrays 210-218 and provides data input/output bits in a range of bit[0]-bit[63].

At least one of the memory units is used as a "voltage and frequency monitor (vfm)" memory unit with a special output mbit. For simplicity, the memory unit 248 is shown as the vfm memory unit and it can be paired with memory unit 246 to share the same data input. The vfm memory unit 248 and memory unit 246 are physically abutted, meaning the physical layout boundaries of the two memory units are physically connected. Physically abutted memory units may share the same wordlines, sense amplifier control signals and write enable control signals. This makes connections of the data input easier to both memory units. In another embodiment, a vfm memory unit and a memory unit 246 can be physically separated, where they can be placed at different locations within a memory device. The plurality of memory units 240-246 receive a first reverse back bias voltage input as Rbb1 204, whereas the vfm memory unit 248 receives a second reverse back bias voltage inputs as Rbb2. In one embodiment, the memory units 240-246 and the vfm memory unit 248 receive the same power supply voltage vddm, and the first reverse back bias voltage input Rbb1 is coupled to the plurality of bitcell arrays 210-216, and the second reverse back bias voltage input Rbb2 is coupled to the vfm bitcell array 218. A data input din[63] 250 as shown in FIG. 2 is respectively coupled to a first data input of memory unit 246 to write data to memory unit 246 and a second data input of the vfm memory unit 248 to write data to the vfm memory unit concurrently in the same address locations. The memory unit 246 has a data output bit[63] and the vfm memory unit has a data output mbit separately. In another embodiment, the first reverse back bias voltage input Rbb1 is coupled to the memory units 240-246, and the second reverse back bias voltage input Rbb2 is coupled to the vfm memory unit 248, such that the reverse back bias voltage inputs Rbb1/Rbb2 are coupled to column multiplexer transistors and sense amplifier transistors as well. The impact of applying back bias to bitcell arrays on operating behavior of memory unit is further discussed below. In other embodiments, memory may have other configurations, other devices, and/or be accessed by other ways. Also in other embodiments, the memory units may be configured differently with different access circuitry. In additionally, the memory units maybe of different sizes.

Figure 3:
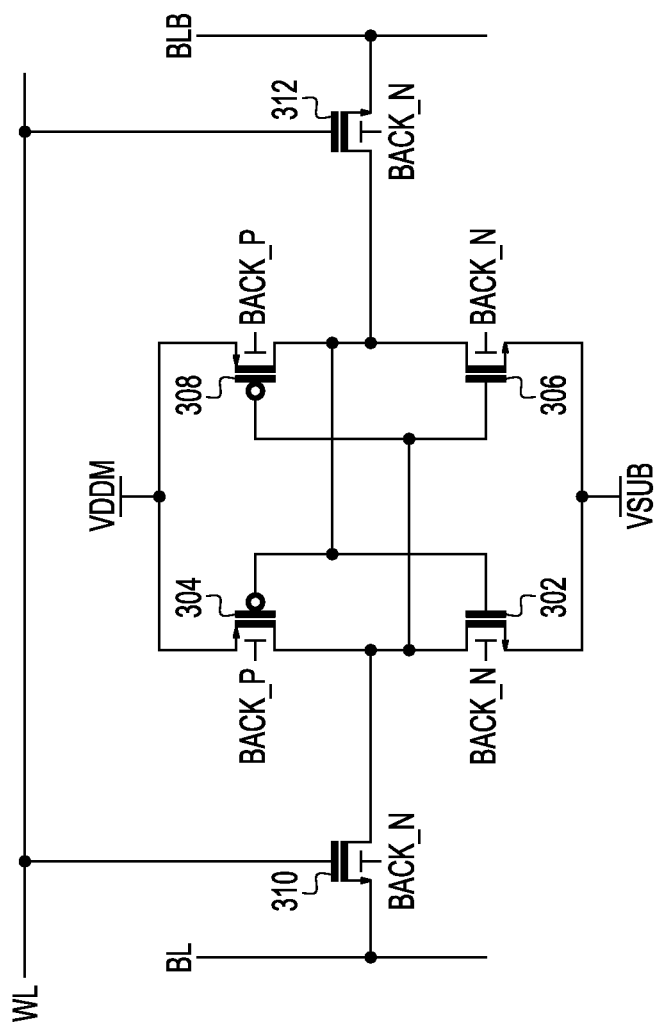
FIG. 3 illustrates, in schematic diagram form, a portion of the embedded memory of FIG. 2, in accordance with one embodiment of the present invention.

FIG. 3 illustrates, in schematic form, a bitcell transistor's back bias terminals in bitcell arrays 210-218, in accordance with one embodiment of the present invention. The 'Back_n' net (also called a P-Well tie) and the 'Back_p' net (also called N-Well tie) are the back bias connection terminals for NMOSFET transistors and PMOSFET transistors respectively. By coupling a voltage potential of Rbb1/Rbb2 on the back bias terminals, the NMOSFET/PMOSFET transistor's current conducting behavior can be modified (to be stronger or weaker) in a way to mimic (emulate) the impact of supply voltage change on memory circuitry in a certain range of Vddm values. In one embodiment for emulating low voltage write operation, the Rbb2 voltage value (a second back bias voltage of the second memory unit is at a second voltage value) is negative and lower than the Rbb1 voltage value (a first back bias voltage of the first memory unit is at a first voltage value), which increases threshold voltage of NMOSFET transistors in the vfm bitcell array 218. As a result, bitcell's NMOSFET pass transistors 310 and 312 in the vfm bitcell array 218 are weaker in current conducting strength than that of the bitcell NMOSFET pass transistors in the bitcell array 216 with the same supply voltage applied to both the bitcell array 216 and the vfm bitcell array 218. This makes the bitcell write operation harder at the same supply voltage. This is in a way equivalent to apply a lower supply voltage to the vfm bitcell array 218, while keeping the Rbb2 voltage value same as the Rbb1 voltage value. Thus the vfm memory unit 248 emulates write operations of the bitcell arrays 210-216 at an effectively lower supply voltage. As same data are written to the memory unit 246 and the vfm memory unit 248 concurrently on every address, predicting the feasibility of memory units 240-246 operating either at a lower supply voltage or at a higher clock frequency can be made possible by reading and comparing the data output bit[63] of the memory unit 246 with the data output mbit of the vfm memory unit 248.

Figure 10:
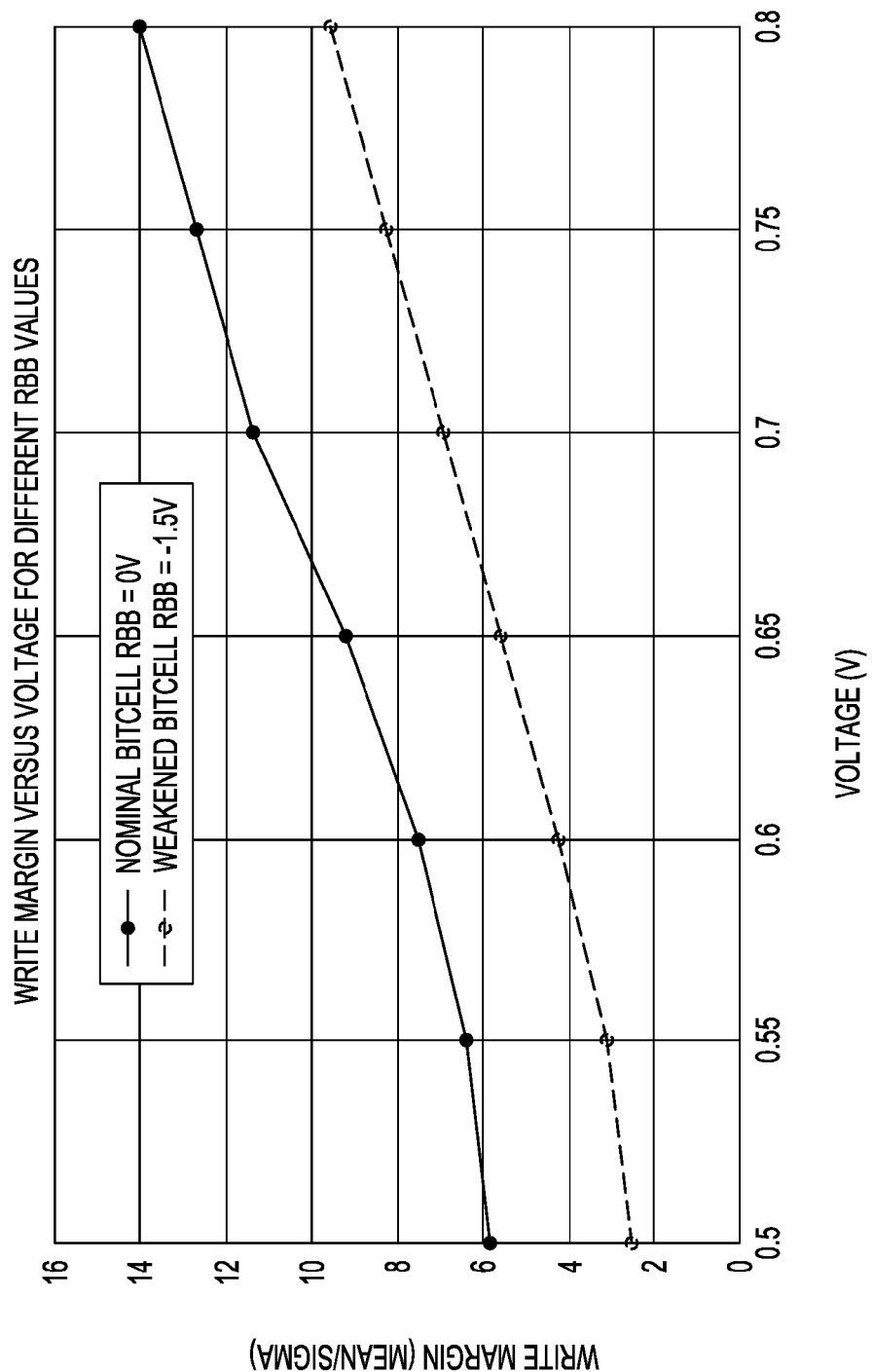
FIG. 10 illustrates, in a line chart form, proven results from simulation of the embedded memory of FIG. 2, in accordance with one embodiment of the present invention.

In another embodiment for emulating low voltage read operation, a Rbb2 voltage value (the second back bias voltage of the second memory unit is at a third voltage value) is positive and higher than the Rbb1 voltage value (a first back bias voltage of the first memory unit is at a first voltage value), which reduces threshold voltage of NMOSFET transistors in the vfm bitcell array 218. As a result, bitcell's NMOSFET pass transistors 310 and 312 in the vfm bitcell array 218 are stronger in current conducting strength than that of the bitcell NMOSFET pass transistors in the bitcell array 216 with the same supply voltage applied to both the bitcell array 216 and the vfm bitcell array 218. This makes the bitcell read operation easier to fail at the same supply voltage. This is in a way equivalent to apply a lower supply voltage to the vfm bitcell array 218, while keeping the Rbb2 voltage value same as the Rbb1 voltage value. Thus the vfm memory unit 248 emulates read operations of the bitcell arrays 210-216 at an effectively lower supply voltage. The feasibility of applying a back bias voltage Rbb to a group of bitcells to emulate impact of lower supply voltage on read/write margin is proven to be effective. A circuit simulation of a memory based on 28 nm technology showed an impact of Rbb voltage on Write Margin vs. operating voltage is shown in FIG. 10. For example, with a Rbb of −1.5V applied on the P-Well of a bitcell array, the write margin at 0.8V supply voltage is equivalent to the write margin at 0.65V with a Rbb of 0V (a typical device P-Well bias). Similarly, a Rbb2 —(or Fbb) of +0.3V applied on the P-Well of a bitcell array, the read margin at 0.8V supply voltage can be made equivalent to a read margin at 0.7V with a Rbb of 0V (a typical device P-Well bias).

Figure 4:
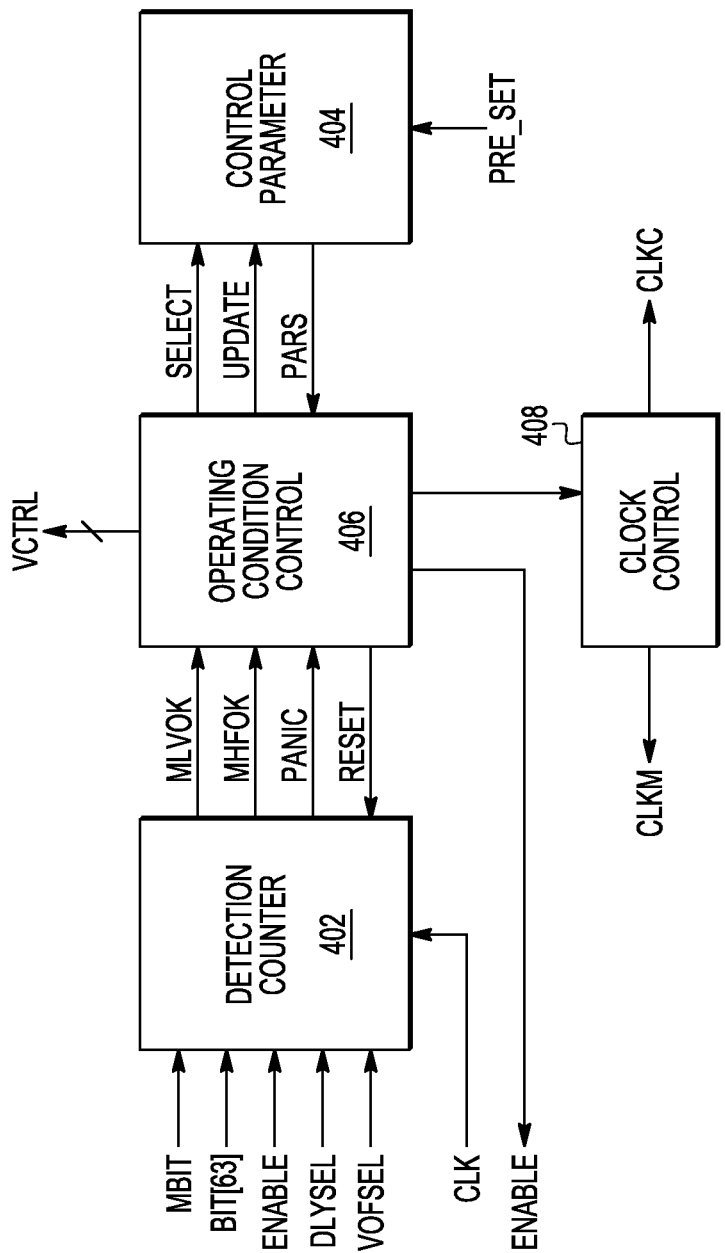
FIG. 4 illustrates, in block diagram form, the control unit of FIG. 1, in accordance with one embodiment of the present invention.

FIG. 4 illustrates, in block diagram form, the control unit of FIG. 1, in accordance with one embodiment of the present invention. A detection counter 402 receives the data output 'mbit' bit and the normal data output bit[63] from the memory 104 and outputs a 'mlvok' signal and a 'mhfok' signal to operating condition control 406 indicating a feasibility to either lower the Vddm value to the next lower setting value and/or to increase memory operating frequency to the next higher value respectively according to a set of predetermined operating condition parameter values contained in a control parameter 404. The decision for changing the supply voltage or operating frequency is controlled by the 'Vofsel' input. An alternative test for feasibility to increase the clock frequency to the next higher value is to add delay circuitry into in the 'mbit' data output path and the added delays can be programmable via the 'dlysel' input. The detection counter 402 may also receive a memory enable signal so it will only count and process the incoming data stream under read operations. The operating condition control 406 will then configure a clock control unit 408 to provide a new clock frequency Clkm to the memory 104. The detection counter 402 contains a decision policy logic to set the 'mlvok' and 'mhfok' outputs by considering a history of data pattern of the 'mbit' and the bit[63] data from the memory 104. For example, if a count number of the most recent 50 (a predetermined threshold 'count1') data samples that contains bit-wise identical 'mbit' and bit[63] data patterns, the 'mlvok' output will be set to a logic "1" indicating a valid feasibility to either lower the Vddm value or to increase the operating frequency value. The detection counter 402 also has a function of detecting if an error rate in the most recent input data stream 'mbit' is above a predetermined threshold value 'count2'. An error occurred when a mismatch in the 'mbit' and bit[63] bit-wise data pattern is detected. In such a case a 'panic' signal can be generated by the detection counter 402 and sent to operating condition control 406. The detection counter 402 and its output signals 'mlvok' and 'mhfok' can be reset (cleared) by operating condition control 406 in cases of POR and/or on a panic event.

Continued on FIG. 4 description on the control unit 400, in which a panic event is detected. The operating condition control 406 can decide whether to disable the memory low voltage monitor and update the control parameter 404 with a new lower limit value on Vddm or a new higher operating frequency value Fmax. One embodiment of updating the control parameters in real time is to assign a status bit field for each control parameters predetermined at product test phase. For example a control parameter register file may contain entries of vddm[0:m] paired with vstat[0:m], and fmax[0:n] paired with fstat[0:n], where each entry values of vddm[0:m] and fmax[0:n] are predetermined and stored in a non-volatile memory location at product test phase. Each SoC chip may have different values in vddm[0:m] and fmax[0:n] parameters given a personality of each die for its memory Vmin, Vmax, and Fmax. When a SoC chip is delivered to a user-mode application, during a real time operation a change on operating condition occurred and the control unit detects a mismatch (error) in the incoming memory data stream 'mbit' and bit[63] on a particular value of vddm or fmax, the operating condition control 406 will set or update the corresponding bit(s) of vstat[0:m] and/or fstat[0:n] to a logic one state. In a way the memory control unit has a self-learning function to capture and remember historical failure conditions and the associated control parameters. In a subsequent memory operation stream, the control unit knows the failure conditions by checking the vstat[0:m] or fstat[0:n] bits, and will avoid selecting the control parameter that has its status bit set. For instance, during a first routine of memory operating condition change for supply voltage, the 0.6v entry value in the vddm[0:m] register has its vstat bit set as a result of mismatch failure when reducing memory supply voltage value. The control unit will then not select supply voltage control parameters that are equal or less than 0.6 v in subsequent memory operations when a supply voltage change is requested by the SoC system regardless if a mismatch of 'mbit' and bit[63] is generated or not. The vstat[0:m] and fstat[0:n] register bits are all cleared to logic zero state at power on reset.

Figure 5:
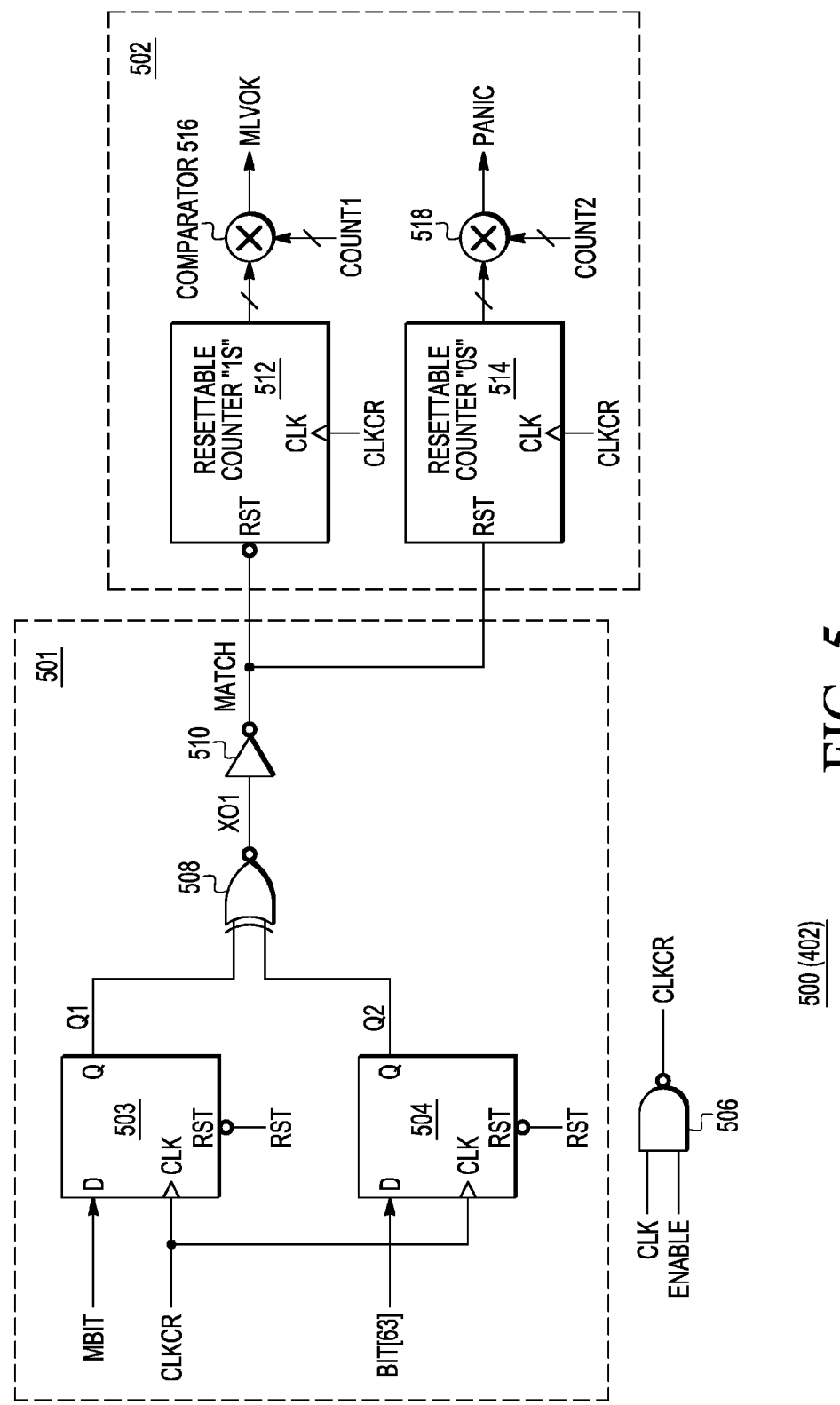
FIG. 5 illustrates, in block diagram form, an embodiment of a portion of the control unit of FIG. 4, in accordance with one embodiment of the present invention.

FIG. 5 illustrates, in block diagram form, an embodiment of the detection counter 402 of FIG. 4, in accordance with one embodiment of the present invention. FIG. 5 includes a 'match' bit comparator block 501 and a counter block 502. The 'match' bit comparator block 501 latches the 'mbit' and the bit[63] signals coming from memory 104 with a pair of flip-flops (FFs) 503 and 504. The clock of the FFs is qualified by a memory read signal by a NAND gate 506 so the data sampling will be only performed in read operations. A similar clock gating control can be implemented for write operation. An XOR gate 508 has two data input ports coupled to the outputs of flip-flops 503 and 504, q1 and q2 nets respectively. The output of XOR gate is further coupled to the input of an inverter 510. The output signal of the inverter 510 'match' can be either a logic '1' indicating no error in the current cycle read operation from memory 104, or a logic '0' indicating an error is detected in the current read cycle. A resettable counter for data bit "1 s"(logic high) 512 and resettable counter for data bit "0s"(logic low) 514 are used to count the number of "1s" and the number of "0s" in the data stream of 'match'. The 'match' signal is coupled to the resetb input of the data "1" counter 512 so that the counter will be reset (cleared) in case of a "0" is detected (indicating a mismatch between the mbit and the bit[63]). The 'match' signal is also coupled to the reset input of the data "0" counter 514 so it will only count for number of "0s"(failure cases). The logic function of the embodiment 500 can be used by an electronic system to either step down memory supply voltage Vddm value with a constant clock frequency or to increase operating frequency of memory 104 with the existing supply voltage value.

Figure 6:
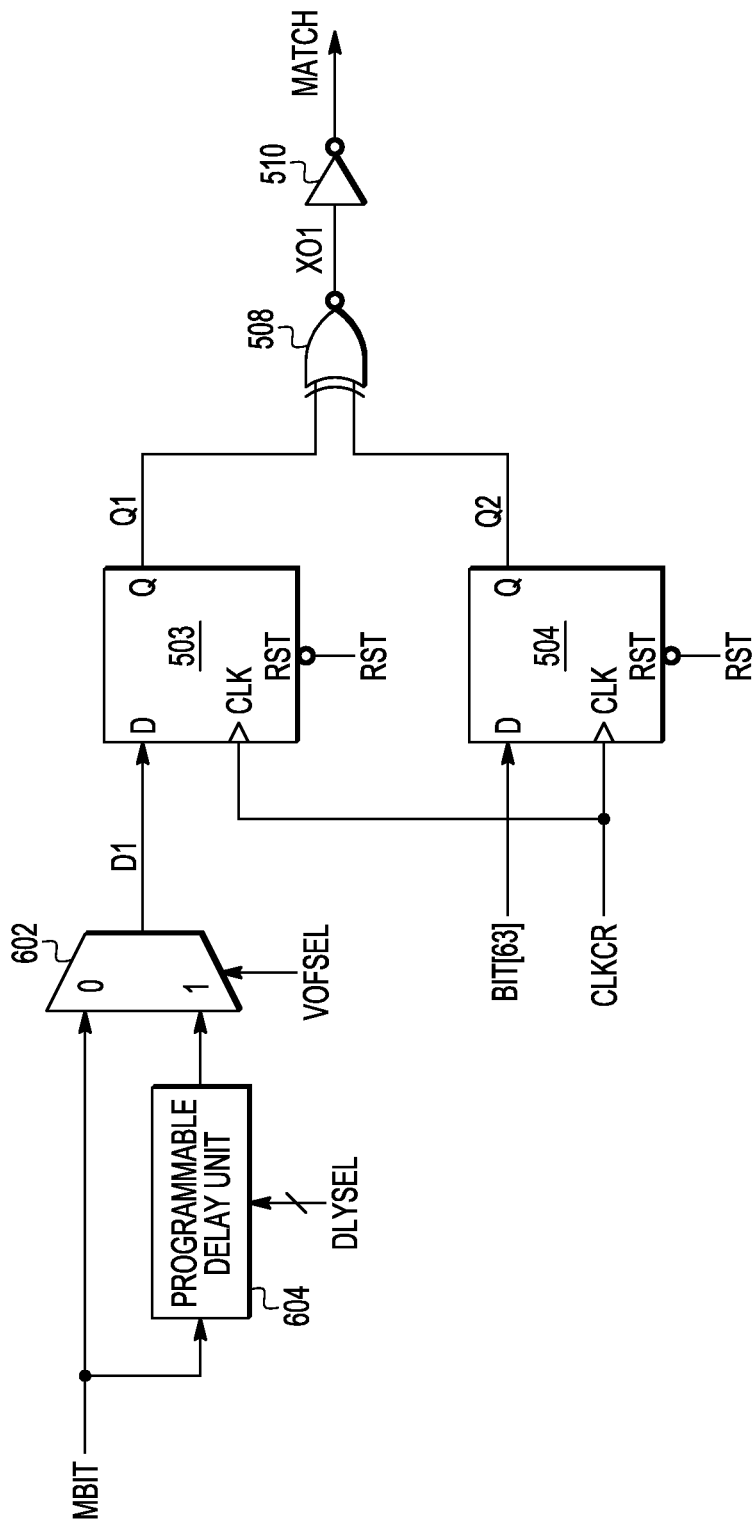
FIG. 6 illustrates, in block diagram form, an embodiment of another portion of the control unit of FIG. 4, in accordance with one embodiment of the present invention.

FIG. 6 illustrates, in block diagram form, another embodiment of the detection counter of FIG. 4, in accordance with the present invention. Embodiment 600 includes the same counter block 502 shown in FIG. 5 (not shown in FIG. 6), but a different 'match' bit comparator block. The function of embodiment 600 is to provide SoC means to test and increase clock frequency of memory 104 while keeping the same supply voltage Vddm value. The 'match' bit comparator block in 600 has a front-end 2:1 mux 602 receiving data of the 'mbit' output from the memory 104. Mux 602 has an output 'd1' coupled to an input terminal 'D' of a FF 503. A first input terminal (port '0') of mux 602 is directly coupled to the 'mbit' output from the memory 104, and a second input terminal (port '1') of the mux is coupled to an output of a programmable delay unit 604, which generates a delayed version of the 'mbit' data signal from memory 104. The amount of delay time is determined by a set of operating condition parameter values contained in the control parameter 404 of the control unit 106. The related operating condition parameter values can be programmed by SoC during run time and coupled to programmable delay unit 604 through the 'dlysel' input terminal. The selection of port '0' or port '1' of mux 602 is controlled by SoC via the 'Vofsel' input terminal. The port '0' is selected with no delay added in the path for the purpose of reducing Vddm with a constant clock frequency, while the port '1' can be selected with a predetermined delay added in the path to test and predict a head-room in clock cycle to increase memory clock frequency with a constant Vddm. For example, a memory 104 designed for a Fmax of 800 MHz read/write operations needs an access time (a.k.a Tcq) of no more than 1250 ps characterized at a given PVT (process, voltage and temperature) point for a non-pipelined SRAM module (or typically less, e.g. Tcq can be 85% of the 1250 ps, considering data setup and signal recovery times). A memory device on a particular die or wafer can run faster or slower than the target Fmax frequency on silicon due to guard band and margining added against PVT variations. For instance, a memory module that can deliver faster speed to achieve 1 GHz performance level (a Tcq of no more than 800 ps) can be test out by inserting at least a delay time of 250 ps in the output data path before a capture latch placed in the boundary of the memory access cycle. In this particular example, a 20% performance increase is achieved with the same nominal power supply voltage (without having to use Vdd over-drive as conventional practices). The rest of embodiment 600 is similar with that of embodiment block 500, except the output of the counter block 502 will be a 'mhfok'(memory higher clk freq ok) signal instead of the 'mlvok' in FIG. 5.

The embodiments described in FIGS. 5 and 6 can be used to remove memory access as a critical timing path in SoC timing closure and so higher clock frequency can be used with improved performance. The access time of an embedded memory module, often specified as Tcq or clock to data output delay time, is most likely one of the critical timing paths in SoC chip timing closure especially for timing paths involving high performance L1 and L2 caches. A primary reason for an embedded memory compiler module to be a critical performance-limiting timing path is the memory has to manage an adequately large internal read/write timing margins (e.g. a sense amplifier differential voltage margin) to protect circuit robustness against variations and uncertainties caused by multiple factors such as fabrication process, operating voltage and temperature, a large number of memory compiler design options, and a cycle access percentage allocation to the next pipeline stage (e.g. a downstream ECC logic). The added timing margins can thus be very conservative and significantly limit the operating frequency, or Tcc, of the memory module. For example, a typical memory compiler design may target the Tcq be less than a predetermined percentage of memory clock cycle time (e.g., 60% of the clock cycle) with a large amount of sense amplifier margin. The memory designed with this conservative margining technique has a large headroom to push performance by increase the operating frequency. The embodiments described in FIGS. 5 and 6 provide at least two ways to reliably increasing memory operating frequency based on real time testing results. One way is to adjust a back-bias voltage of the vfm memory unit 248 to weaken bitcell array and peripheral devices. The other way is to add programmable delays in the memory output path 'mbit'. The amount of frequency increase can be determined by back-bias voltage values or the amount of delays added, as defined in the control parameters 404.

Figure 7:
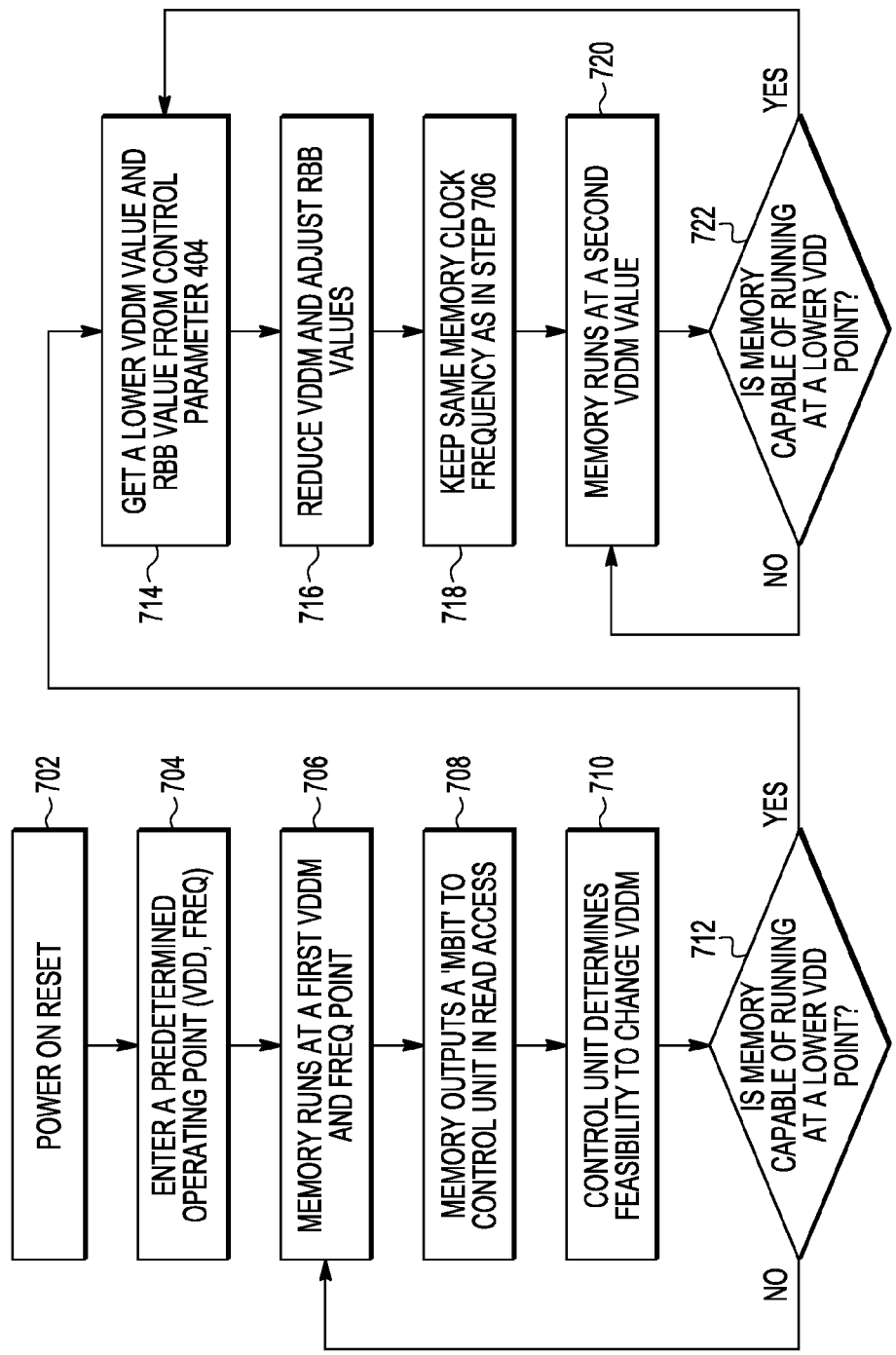
FIGS. 7, 8, and 9 illustrate, in flow diagram form, operations within the semiconductor device system of FIG. 1.

FIG. 7 illustrate, in flow diagram form, a method 700 within semiconductor device 100, including a memory operating condition change routine, in accordance with one embodiment of the present invention. Method 700 describes a first routine of changing memory supply voltage with a constant operating frequency and reduce the memory supply voltage Vddm with a coarse voltage step, e.g. 100 mV, predefined in the control parameter 404. Method 700 begins with block 702 in which the chip is powered on in a reset mode. The method proceeds to step 704 in which the semiconductor device enters a predetermined operating condition with predetermined supply voltage and operating frequency. For example, after a power-on reset routine is completed, the semiconductor device may be programmed to enter a functional operation with a nominal supply voltage and a target operating frequency. The method proceeds to step 706 in which the memory device operates at the nominal supply voltage as its first supply voltage value and the target operating frequency as its first operating frequency value. The memory device also receives at least one back bias voltage from a back bias generator 110. The method proceeds to step 708 in which the memory device outputs a special data bit 'mbit' and a nominal data output bit[63] to control unit 106. The data output mbit provides real time information to control unit 106 for feasibility of memory operating condition change (supply voltage, operating frequency, etc.) in every memory cycle of accesses. The method proceeds to step 710 in which the control unit determines a feasibility to change memory operating condition, wherein in method 700 changing operating condition means operating at a lower supply voltage. The feasibility of changing memory supply voltage can be determined by a data matching test of the special data bit 'mbit' vs the nominal data output bit[63] in the control unit. The method proceeds to decision diamond 712 in which it is determined if the memory 104 is capable operating at a predetermined lower supply voltage point. The predetermined lower supply voltage values can be programmed to be unique per die as a result of the real time feasibility testing so a maximum potential of power saving can be achieved without compromise performance. As a result, method 700 considered local and global process variations and device aging into the operating condition change routine. If memory 104 is not capable of operating at a lower supply voltage point, method 700 proceeds to step 706 in which the memory keeps running at the first or present supply voltage point.

If, at decision diamond 712, memory 104 is determined capable of operating at a lower supply voltage point, method 700 proceeds to a supply voltage change preparation routine 714. The control unit selects a lower voltage value in a coarse voltage change step, e.g. 100 mV, predefined in the control parameter 404. The control unit may adjust the back bias voltage value in accordance with the lower voltage value. The method proceeds to step 716 in which the memory supply voltage terminal is provided with the lower voltage value and the memory's back bias voltage terminal is provided with the adjusted back bias voltage value. The method proceeds to step 718 in which the control unit keeps the first operating frequency value unchanged for clock frequency of memory 104. As discussed in the description of FIG. 6, a memory compiler module is often designed with conservative margining technique that has an adequate headroom to keep the same operating frequency at a lower supply voltage point. Method 700 provides a reliable way to maintain memory operating frequency near its peak value while reducing supply voltage in a predictable range based on real time memory testing results. The method proceeds to step 720 in which the memory 104 operates with the lower supply voltage and the same operating frequency value. While memory 104 is working, the control unit concurrently checks a real time test result in decision diamond 722 in which it is determined if the memory 104 is capable operating at a next lower supply voltage point predetermined in the control parameters. If memory 104 is not capable of operating at the next lower supply voltage point, method 700 proceeds to step 720 in which the memory keeps running at the present supply voltage point. If, at decision diamond 722, memory 104 is determined capable of operating at the next lower supply voltage point, method 700 proceeds to the supply voltage change preparation routine 714 and repeat the steps described thereafter.

Figure 8:
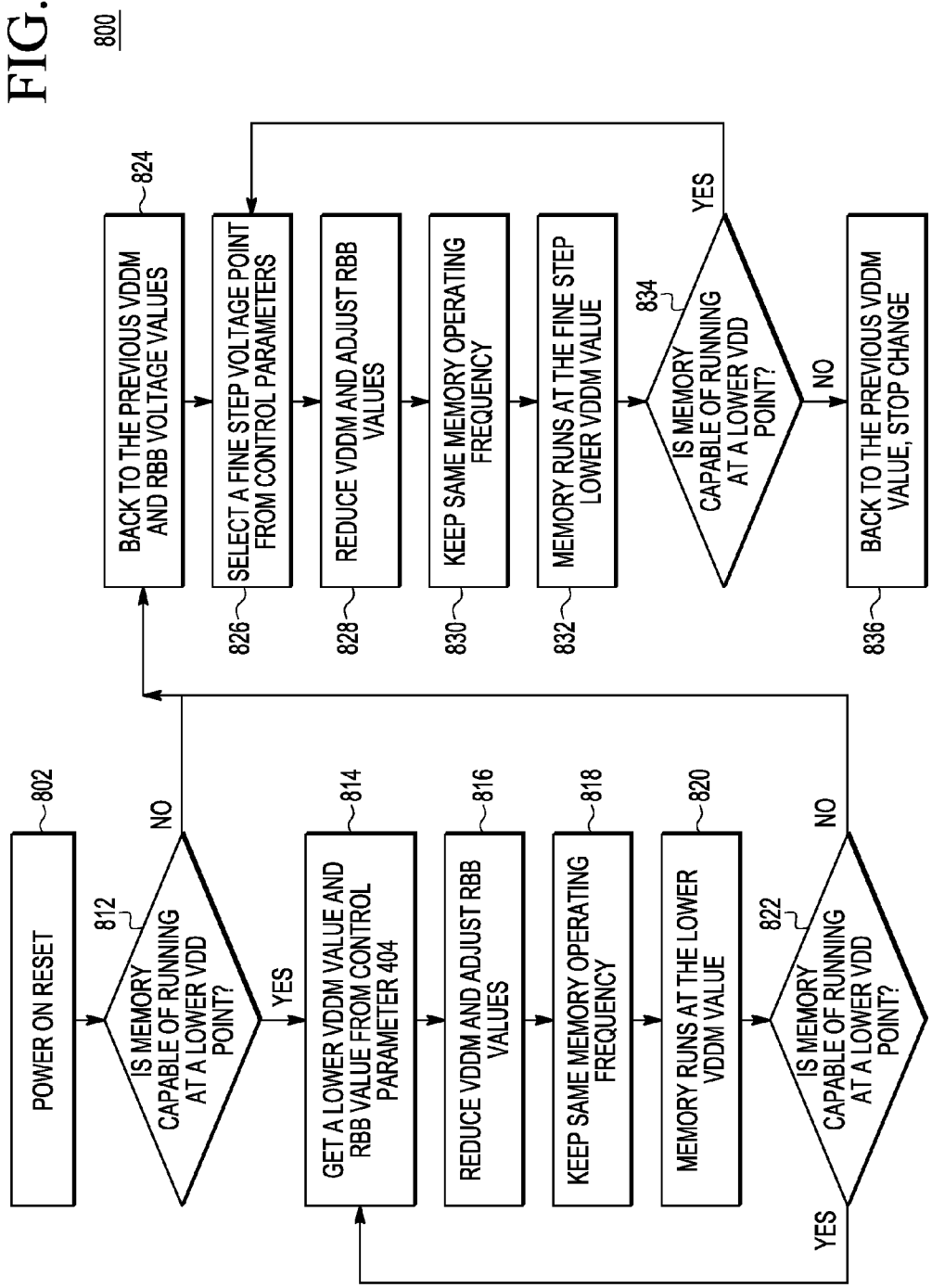

FIG. 8 illustrate, in flow diagram form, a method 800 within semiconductor device 100, including a memory operating condition change routine, in accordance with one embodiment of the present invention. Method 800 describes a second routine of changing memory supply voltage similar to the first routine described in method 700. The main difference is that with method 800 the control unit reduces the memory supply voltage with a fine step smaller than the coarse voltage step used in method 700, after a failure is detected at a supply voltage point set by the coarse voltage step. The description of method 800 is focused on the differences. Method 800 begins with block 802 in which the chip is powered on in a reset mode. The following steps in method 800 between 802 and 812 are identical to that of method 700 and so for simplicity not shown in the flow diagram. The method proceeds to decision diamond 812 in which it is determined if the memory 104 is capable operating at a predetermined lower supply voltage point. If memory 104 is capable of operating at a lower supply voltage point, method 800 proceeds to an operating condition change routine described in steps 814 to 820 which are identical to steps 714 to 720 described in method 700. If, at decision diamond 812 or 822, memory 104 is determined not capable of operating at a lower supply voltage point, meaning a failure is detected from the 'mbit' of the memory by the control unit when the memory runs at a lower supply voltage point set by a coarse voltage step, method 800 proceeds to step 824 in which the control unit sets memory supply voltage back to the previous value before the change with the coarse voltage step with the associated back bias voltage values. The method 800 proceeds to a supply voltage change routine 826, in which the control unit selects a lower voltage value with a fine step voltage increment, e.g. 50 mV, predefined in the control parameters 404. The method 800 proceeds to steps from 828 to a decision diamond 834, which are identical to steps 716 to decision diamond 722 in method 700 described before. At decision diamond 834, if memory 104 is not capable of operating at the lower supply voltage point set by a fine step increment, method 800 proceeds back the previous vddm value and stop change in operating condition. If, at decision diamond 834, memory 104 is determined capable of operating at the lower supply voltage point, method 800 proceeds to the supply voltage change routine 826 to 832 and repeat the steps described in steps 716 to decision diamond 722 of method 700.

Figure 9:
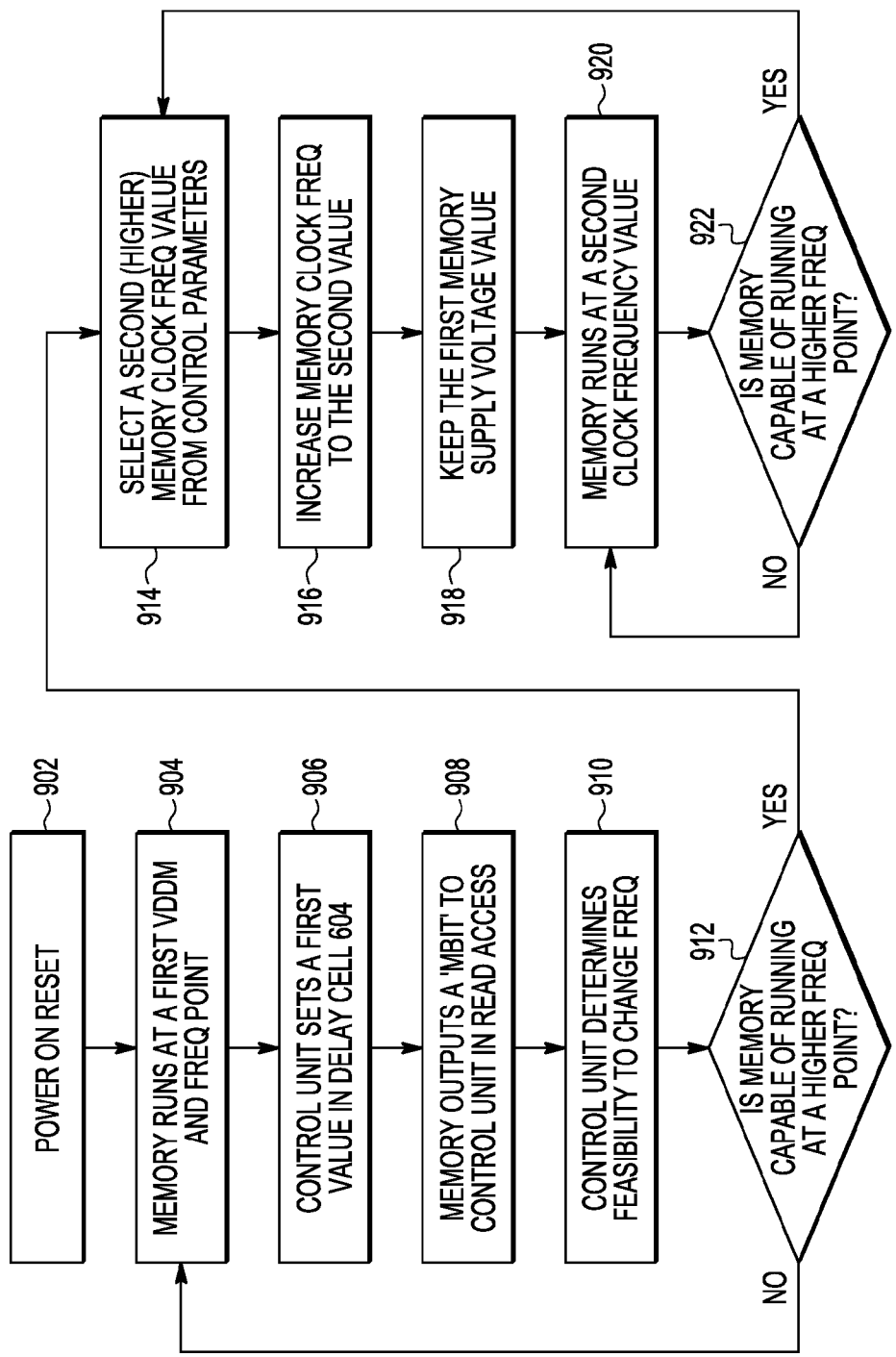

FIG. 9 illustrate, in flow diagram form, a method 900 within semiconductor device 100, including a memory operating condition change routine, in accordance with one embodiment of the present invention. Method 900 describes a third routine of changing memory operating frequency similar to the first routine of changing memory supply voltage described in method 700. The main difference is that with method 900 the control unit increases memory operating frequency, based on a feasibility test result, instead of reducing memory supply voltage described in method 700. The description of method 900 will be focused on the differences. Method 900 begins with block 902 in which the chip is powered on in a reset mode. The method proceeds to step 904 in which the memory device operates at a first supply voltage value (e.g. the nominal supply voltage) and a target operating frequency as its first operating frequency value. The method proceeds to step 906 in which the control unit selects a first delay value for delay unit 604, wherein the delay values are predetermined in the control parameters. The method proceeds to step 908 in which the memory device outputs a special data bit 'mbit' and a nominal data output bit[63] to control unit. The method proceeds to step 910 in which the control unit determines a feasibility to change memory operating condition, wherein in method 900 changing operating condition means operating at a higher operating frequency. The method proceeds to decision diamond 912 in which it is determined if the memory 104 is capable operating at a predetermined higher operating frequency value. The predetermined higher operating frequency values can be programmed to be unique per die during chip testing process such that a maximum performance at a given supply voltage can be achieved. As the feasibility test runs real time concurrently with memory accesses, method 900 considered local mismatch and global process variations and device aging into the operating condition change routine. If memory 104 is not capable of operating at a higher operating frequency value, method 900 proceeds to step 904 in which the memory keeps running at the first or present operating frequency value.

If, at decision diamond 912, memory 104 is determined capable of operating at a higher operating frequency value, method 900 proceeds to an operating frequency change preparation routine 914. The control unit selects a higher operating frequency value in a coarse frequency change step, e.g. 100 MHz, predefined in the control parameter 404. The method proceeds to step 916 in which the memory's operating clock terminal is provided with the higher operating frequency value. The method proceeds to step 918 in which the control unit keeps the first memory supply voltage value unchanged. The method proceeds to step 920 in which the memory 104 operates with the higher operating frequency value and the same supply voltage value. While memory 104 is operating, the control unit concurrently checks a real time test result in decision diamond 922 in which it is determined if the memory 104 is capable operating at a next higher operating frequency value predetermined in the control parameters. If memory 104 is not capable of operating at the next higher operating frequency value, method 900 proceeds to step 920 in which the memory keeps running at the present operating frequency point. If, at decision diamond 922, memory 104 is determined capable of operating at the next higher operating frequency value, method 900 proceeds to the operating frequency change preparation routine 914 and repeat the steps described thereafter.

A flow of changing memory operating frequency with a fine step smaller than the coarse frequency step, essentially similar to method 800, can be used in method 900 if memory 104 is determined not capable of operating at a higher operating frequency value with a coarse frequency change step. In such a case, the control unit selects a second delay value smaller than the first delay value, wherein the second delay value is corresponding to a smaller frequency change step, e.g. 50 MHz.

Therefore, by now it can be appreciated how a memory read data match and mismatch based feasibility test routine can be used to enable real time memory operating condition change. The operating condition change can be either a supply voltage value change or an operating frequency value change or both. The real time operating condition change routine gives a minimum supply voltage Vmin personality per die or a maximum operating frequency Fmax personality per die, and can be used in electronic system applications to achieve the maximum potential for high performance and low power. In one embodiment, a memory device with the feasibility test routine receives a back bias voltage to mimic an intended operating condition. Note that the read data matching based feasibility test routine can be used in any memory system, such as an SRAM or DRAM, MRAM, or in an NVM. The function and embodiments of predicting feasibility of memory operating condition change to provide per die based low power and/or high performance operations can be used in other semiconductor devices than System-on-Chip (SoC).

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of semiconductor device 100 are circuitry located on a single integrated circuit or within a same device. Alternatively, semiconductor device 100 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, rather than a SRAM used as memory 104, the above descriptions apply to a DRAM as well. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operating a memory device, the method comprising:
   writing a data into both a first memory unit of the memory device and a second memory unit of the memory device while the memory device is operating at a first operating condition including a first supply voltage being supplied to both the first memory unit and the second memory unit and the memory device is at a first operating frequency;
   reading, after the writing, the data from the first memory unit and from the second memory unit while the memory device is operating in the first operating condition, wherein the reading is performed while a first back bias voltage is being provided to transistors of a first conductivity type of the first memory unit and a second back bias voltage is being provided to transistors of the first conductivity type of the second memory unit, the first back bias voltage is different from the second back bias voltage;
   comparing the data read from the first memory unit with the data read from the second memory unit;
   determining based on the comparing, a feasibility of a second operating condition of the memory device, wherein the second operating condition is different than the first operating condition by at least one of a group consisting of a different supply voltage from the first supply voltage to a memory unit of the memory device and a different operating frequency than the first operating frequency; and
   if determined to be feasible, operating the memory device at the second operating condition, wherein operating the memory device includes reading and writing data to the first memory unit in the second operating condition.

2. The method of claim 1, wherein the writing and reading further comprising:
   writing the data into both the first memory unit and the second memory unit of the memory device at a same address for both the first memory unit and the second memory unit; and
   reading the data from both the first memory unit and the second memory unit of the memory device at the same address.

3. The method of claim 1, wherein the first memory unit and the second memory unit are coupled to a same set of wordlines, a same set of sense amplifier control signals and a same set of write control signals.

4. The method of claim 1, where the determining further comprising:
   determining whether the data read from the first memory unit matches the data read from the second memory unit;
   incrementing a first count in a first register as a result of a match from the determining;
   validating the second operating condition of the memory device if the first count is greater than a first predetermined number;
   transitioning from the first operating condition to the second operating condition based on the validating; and
   resetting the first count as a result of entering the second operating condition.

5. The method of claim 1, further comprising:
   determining whether the data read from the first memory unit mismatches the data read from the second memory unit;
   setting a flag indicating a predictable failure condition of the memory device to transition to the second operating condition as a result of a mismatch found from the determining.

6. The method of claim 1, further comprising:
   wherein operating at the second operating condition includes operating at a lower supply voltage than the first supply voltage.

7. The method of claim 6, wherein operating at the first operating condition and the second operating condition includes operating at a same operating frequency applied to the memory device.

8. The method of claim 1, wherein operating at the second operating condition includes operating at a higher operating frequency than the first operating frequency.

9. The method of claim 8, wherein operating at the first operating condition and the second operating condition includes operating with the first supply voltage applied to the memory device.

10. A semiconductor device comprising:
a first memory unit of a memory device comprising a first back bias terminal for biasing transistors of a first conductivity type,
a second memory unit of the memory device comprising a second back bias terminal for biasing transistors of the first conductivity type;
a data input coupled to write data to the first memory unit and to the second memory unit concurrently;
a back bias generator including a first output to provide a back bias voltage to the first back bias terminal and a second output to provide a back bias voltage to the second back bias terminal, wherein the back bias generator can provide different back bias voltages to the first back bias terminal and the second back bias terminal at a same time;
a control unit including circuitry, the control unit includes:
a first output coupled to the back bias generator to control the back bias voltage provided to the second back bias terminal;
a comparison circuit including a first comparator input, a second comparator input, and a match output, the first comparator input is operably coupled to a data output of the first memory unit, the second comparator input is operably coupled to a data output of the second memory unit, the match output provides a determination of whether data received at the first comparator input and the second comparator input match;
a second output to provide an operating condition parameter value of the memory device from a plurality of operating condition parameter values associated with an operating condition parameter, wherein the operating condition parameter includes one of a group consisting of a supply voltage provided to the memory device, an operating frequency of the memory device, wherein the operating condition parameter value indicated by the second output is dependent upon the match output of the comparison circuit comparing data from the first memory unit and the second memory unit during a read operation where a back bias voltage provided to the first back bias terminal was different than a back bias voltage provided to the second back bias terminal.

11. The semiconductor device of claim 10, wherein the control unit further comprises:
a first status indicator wherein the first status indicator is set to a first state at power on;
wherein the first status indicator is changed to a second state in response to the match output providing a determination of the data received at the first comparator input and the data received at the second comparator input does not match.

12. The semiconductor device of claim 10, wherein:
a first operating condition parameter value is indicative of a first operating condition and a second operating condition parameter value is indicating of a second operating condition;
the first operating condition includes a first supply voltage provided to the memory device; and
the second operating condition includes a second supply voltage provided to the memory device different than the first supply voltage.

13. The semiconductor device of claim 10, wherein:
a first operating condition parameter value is indicative of a first operating condition and a second operating condition parameter value is indicating of a second operating condition;
the first operating condition includes a first operating frequency being provided to the memory device; and
the second operating condition includes a second operating frequency provided to the memory device different than the first operating frequency.

14. The semiconductor device of claim 10, wherein the control unit further comprising:
a first counter having an input, wherein the input of the first counter is coupled to the match output of the comparison circuit, wherein the first counter increments when the match output has a value indicating the data received at the first comparator input and the data received at the second comparator input matches;
wherein the first counter resets when the match output has a value indicating the data received at the first comparator input and the data received at the second comparator input mismatches.

15. The semiconductor device of claim 14 wherein the control unit changes the operating condition parameter value when a count of the first counter is greater than a predetermined number.

16. The semiconductor device of claim 10, wherein the control unit further comprising:
a counter having an input, wherein the input of the counter is coupled to the match output of the comparison circuit, wherein the counter increments when the match output has a value indicating the data received at the first comparator input and the data received from the second comparator input mismatches;
wherein the counter resets when the match output has a value indicating the data received at the first comparator input and the data received at the second comparator input matches.

17. The semiconductor device of claim 10 wherein the control unit is capable of providing a first operating condition parameter value and a second operating condition parameter value each associates with an operating condition parameter, the operating condition parameter includes a supply voltage provided to the first and second memory unit, wherein the first operating condition parameter value indicates a first supply voltage that is different from a supply voltage indicated by the second operating condition parameter value, wherein the supply voltage transitions to the supply voltage indicated by the second operating condition parameter value from the first supply voltage based on a comparison match of a first data out from the first memory unit and a second data output from the second memory unit.

18. The semiconductor device of claim 10 wherein the control unit is capable of providing a first operating condition parameter value and a second operating condition parameter value each associates with an operating condition parameter, the operating condition parameter includes an operating frequency provided to the first and second memory unit, wherein the first operating condition parameter value indicates a first operating frequency that is different from a second operating frequency indicated by the second operating condition parameter value, wherein the operating frequency transitions to the second operating frequency from the first operating frequency based on a comparison match of a first data out from the first memory unit and a second data output from the second memory unit.

19. The semiconductor device of claim 10, further comprising:
   a delay unit coupled between the second comparator input and the data output from the second memory unit, wherein the delay unit delays by a delay time the data being provided to the second comparator input from the data output of the second memory unit with respect to the data being provided to the first comparator input from the data output of the first memory unit.

20. The semiconductor device of claim 10, wherein the control unit further comprises:
   a status register providing for each operating condition parameter value, an indication associated with the operating condition parameter value indicating that a mismatch occurred as indicated by the comparison circuit comparing data from the first memory unit and the second memory unit during a read operation where a back bias voltage provided to the first back bias terminal was different than a back bias voltage provided to the second back bias terminal during a test to determine a feasibility of an operating condition associated with the operating condition parameter value.

* * * * *